United States Patent [19]

Takeshita

[11] Patent Number: 4,638,361
[45] Date of Patent: Jan. 20, 1987

[54] SOLID STATE IMAGE PICKUP

[75] Inventor: Kaneyoshi Takeshita, Tokyo, Japan

[73] Assignee: Sony Corporation, Tokyo, Japan

[21] Appl. No.: 499,159

[22] PCT Filed: Sep. 17, 1982

[86] PCT No.: PCT/JP82/00374
§ 371 Date: May 16, 1983
§ 102(e) Date: May 16, 1983

[87] PCT Pub. No.: WO83/01170
PCT Pub. Date: Mar. 31, 1983

[30] Foreign Application Priority Data
Sep. 17, 1981 [JP] Japan .................. 56-146873

[51] Int. Cl.$^4$ ............................................. H04N 3/14
[52] U.S. Cl. ................................................... 358/213
[58] Field of Search ........................... 358/213, 212;
357/24 LR

[56] References Cited
U.S. PATENT DOCUMENTS

| 4,117,514 | 9/1978 | Terui et al. | 358/213 |
|---|---|---|---|
| 4,455,575 | 6/1984 | Murakoshi | 358/213 |
| 4,462,047 | 7/1984 | Fujimoto et al. | 358/213 |
| 4,500,924 | 2/1985 | Ohta | 358/213 |

Primary Examiner—Gene Z. Rubinson
Assistant Examiner—Stephen Brinich
Attorney, Agent, or Firm—Hill, Van Santen, Steadman & Simpson

[57] ABSTRACT

In a solid state image pickup apparatus employing a solid state image pickup device of the interline transfer type which comprises a plurality of photodetectors (1) arranged horizontally and vertically, transfer gate areas (6) each corresponding to each of the photodetectors (1), vertical transfer portions (2), a horizontal transfer portion (4) and an output portion (5), a reading pulse voltage taking a first high level ($V_R$) is applied to each of two of the transfer gate areas (6) adjacent in the vertical direction alternately at every field period, so that signal charges are read out to the vertical transfer portions (2) from the photodetectors (1) corresponding to the transfer gate areas (6) to which the reading pulse voltage is applied, a voltage taking a second high level ($V_H$) lower than the first high level ($V_R$) is applied to the storage regions of the vertical transfer portions (2) during each horizontal video period, transfer pulse voltages taking the low level ($V_L$) in turn at the respective different phases within each horizontal blanking period are applied to the vertical transfer portions (2), so that the signal charges read out to the vertical transfer portions (2) are transferred vertically, and the signal charges transferred vertically are further transferred horizontally through the horizontal transfer portion (4) to the output portion (5), thereby to produce an image pickup signal output.

1 Claim, 19 Drawing Figures

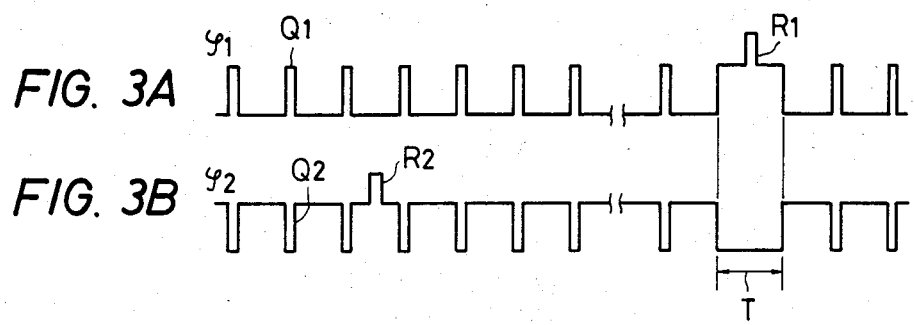
FIG. 3A
FIG. 3B
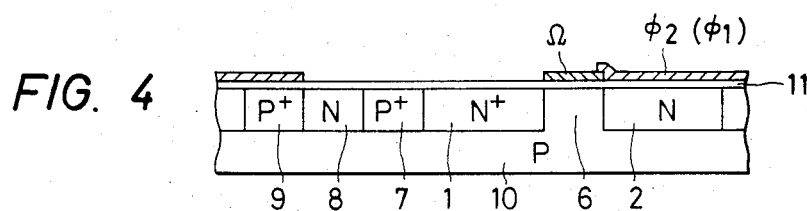
FIG. 4
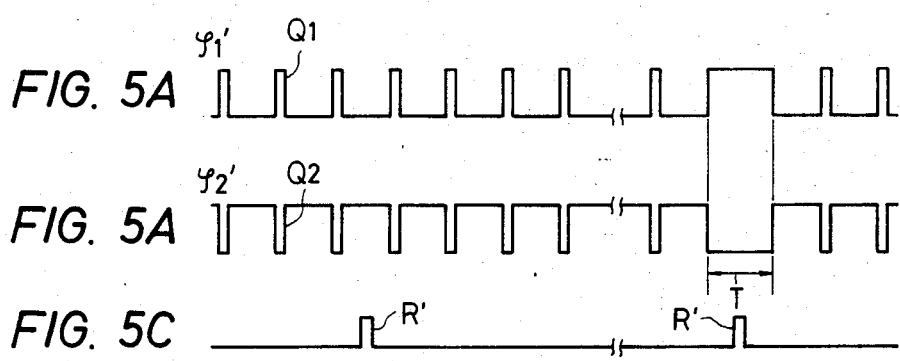
FIG. 5A
FIG. 5A
FIG. 5C

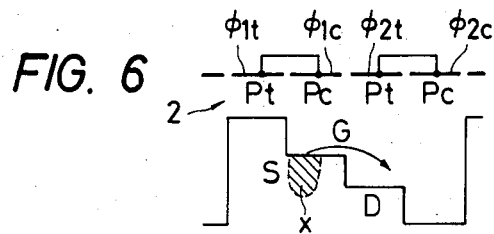
FIG. 6
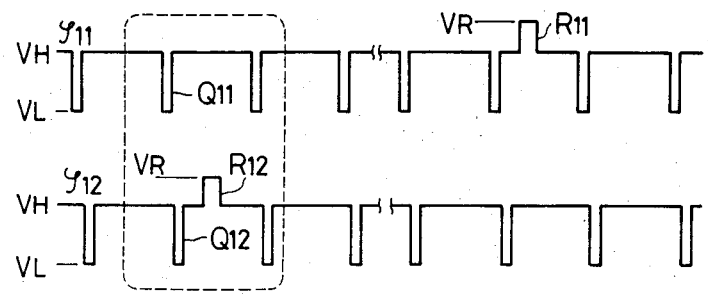
FIG. 7A
FIG. 7B
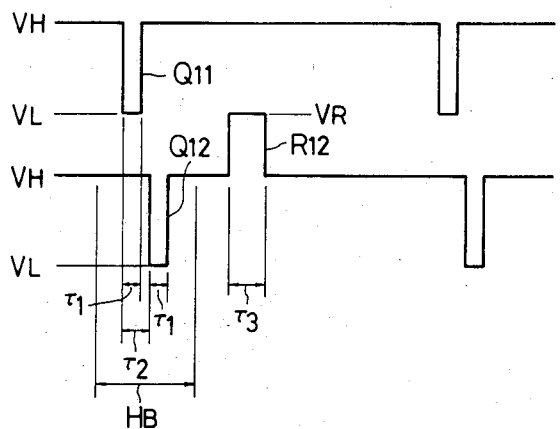
FIG. 8A
FIG. 8B

SOLID STATE IMAGE PICKUP

TECHNICAL FIELD

This invention relates to solid state image pickup apparatus employing a solid state image pickup device which comprises a charge transfer device, and more particularly, is directed to an improved solid state image pickup apparatus employing a solid state image pickup device of the interline transfer type, in which the driving condition for charge transfer performed in the solid state image pickup device is contrived so that a certain defect on a reproduced picture obtained in response to an image pickup signal output derived therefrom is eliminated.

TECHNICAL BACKGROUND

Solid state image pickup devices comprising a charge transfer device such as a charge coupled device ( hereinafter referred to as a CCD ) are classified broadly into the frame transfer type and the interline transfer type, and each of them is utilized in different way so as to make a good use of its advantages and features. One example of the solid state image pickup device of the interline transfer type using the CCD comprises a photo-sensing and vertical transfer portion which includes a plurality of photodetectors arranged in horizontal and vertical rows and vertical transfer portions each formed with a group of CCDs and extending along each of the vertical rows of the photodetectors, a horizontal transfer portion coupled with the photo-sensing and vertical transfer portion and an output portion coupled with the horizontal transfer portion and provided with an signal output terminal, the whole of which are formed on a common semiconductor substrate.

In a solid state image pickup apparatus employing such a solid state image pickup device of the interline transfer type using the CCD, a vertical driving signal for vertical charge transfer is applied to the vertical transfer portions through vertical transfer electrodes which are provided on an insulating layer overspreading the photosensing and vertical transfer portion and a horizontal driving signal for horizontal charge transfer is applied to the horizontal transfer portion through horizontal transfer electrodes which are provided on an insulating layer overspreading the horizontal transfer portion, so that vertical charge transfer operation and horizontal charge transfer operation are performed in the vertical transfer portions and the horizontal transfer portion, respectively. For example, signal charges obtained in the photodetectors in response to the light received thereby during one frame period are read out to the vertical transfer portions, and then transferred toward the horizontal transfer portion by the vertical charge transfer operation performed in the vertical transfer portion so that the signal charges produced in each horizontal row of the photodetectors are transferred in turn to the horizontal transfer portion. The signal charges transferred to the horizontal transfer portion are further transferred to the output portion by the horizontal charge transfer operation performed in the horizontal transfer portion and as a result of this an image pickup signal output is obtained at the signal output terminal.

When a picture is reproduced in response to an image pickup signal output obtained under such operation of the solid state image pickup device of the interline transfer type as described above in a previously proposed solid state image pickup apparatus, it is often seen that such a defect as to appear to be a pair of black and white spots contiguous up and down to each other arises on the reproduced picture. This defect is usually called "white and black spots", and the black spot therein tends to elongate when the image pickup signal output is produced under relatively low illuminance. Such white and black spots can not be eliminated by means of ordinary defect correction, because they result from a local area of deep ( high ) potential residing in the vertical transfer portion. This local area of deep potential in the vertical transfer portion appears at a region having high impurity density which is provided undesirably due to nonuniformity in impurity density in the vertical transfer portion or at a region positioned under a thick portion of the insulating layer which is provided undesirably due to nonuniformity in thickness of the insulating layer on the vertical transfer portion, and is a structural defect in the image pickup device.

In the case of the image pickup device in which such a local area of deep potential in the vertical transfer portion as described above resides, an insulated gate field effect transistor ( hereinafter referred to as a MOS FET ) having its source at the local area of deep potential is substantially formed in the vertical transfer portion and a flow of charges is caused from the local area of deep potential to an advanced potential well in the vertical transfer portion as a sub-threshold current of the MOS FET. If a charge transfer period in which each charge transfer in the vertical transfer portions is carried out is constant and the manner of repetition of such charge transfer periods is made uniform, the amount of charges flowing into the advanced potential well from the local area of deep potential is not varied and therefore the charges flowing into the advanced potential well from the local area of deep potential do not raise any serious problem. However, as to the charge transfer operation in the vertical transfer portions, an exceptional situation in which the charge transfer period is elongated in comparison with that in the normal situation arises, for example, once a frame period, and during such elongated charge transfer period, the local area of deep potential sends the charges stored therein in large quantities into the advanced potential well so as to supply excessive signal charges to the latter and, to the contrary, to make areas positioned behind be lacking in signal charges. This results in that the signal charges are in unbalanced quantities so that an image pickup signal output developed therefrom is deteriorated and the white and black spots appear on a picture reproduced in response to the deteriorated image pickup signal output.

In view of the cause of the white and black spots mentioned above, it is understood that the problem of the white and black spots can be solved by means of maintaining the charge transfer period, in which each charge transfer in the vertical transfer portions is carried out, to be constant regardless of the operation for reading out the signal charges to the vertical transfer portions from the photodetectors.

Accordingly, it is an object of the present invention to provide an solid state image pickup apparatus employing a solid state image pickup device of the interline transfer type, in which the driving condition for charge transfer performed in vertical transfer portions provided in the solid state image pickup device is improved so that a charge transfer period in which each charge transfer in the vertical transfer portions is carried out is made uniform and consequently an image pickup signal output from which a picture without the defect called usually "white and black spots" is reproduced can be obtained from the apparatus.

DISCLOSURE OF THE INVENTION

According to an aspect of the present invention, in a solid state image pickup apparatus employing a solid state image pickup device of the interline transfer type which comprises a plurality of photodetectors arranged vertically and horizontally, transfer gate areas each corresponding to each of the photodetectors, vertical transfer portions, a horizontal transfer portion and an output portion; a reading pulse voltage taking a first high level is applied to each of two transfer gate areas adjacent in the vertical direction alternately at every field period, a voltage taking a second high level lower than the first high level is applied to the storage regions of the vertical transfer portions during each horizontal video period, and transfer pulse voltages taking a low level in turn at the respective different phases within each horizontal blanking period are applied to the vertical transfer portions. In this driving manner for making the solid state image pickup device operative, signal charges are read out to the storage regions of the vertical transfer portions from the photodetectors corresponding to the transfer gate areas to which the reading pulse voltage taking the first high level is applied, then transferred vertically through the vertical transfer portions to the horizontal transfer portion in response to the transfer pulse voltages applied to the vertical transfer portions in the horizontal blanking period and further transferred horizontally through the horizontal transfer portion to the output portion.

With the solid state image pickup apparatus thus constituted in accordance with the present invention, even if the solid state image pickup device of the interline transfer type employed therein contains a defective local area having deep potential in the vertical transfer portions, an image pickup signal output, which is produced in accordance with the frame interlace reading manner and does not cause a defect on a picture reproduced therefrom which otherwith would be resulted from the defective local area in the image pickup device, can be obtained. Futher, since the image pickup device containing therein such a defective local area can be used as a normal device, the yield rate in manufacturing is substantially improved. Moreover, since the rate of times in which both of vertical driving signals supplied at the respective different phases to vertical transfer electrodes provided on the image pickup device take a high level voltage is increased, such an additional effect that an overflow drain formed with a buried channel in the image pickup device is stabilized in its operation and smears arising in the first and second field periods constituting each frame period are reduced to an average so that the difference in brightness between each two field pictures reproduced in response to the image pickup signal output derived from the apparatus is reduced, can be obtained.

BRIEF DESCRIPTION OF THE DRAWINGS

FIGS. 3-A and 3-B are waveform diagrams showing one example of a set of driving signals used for a photo-sensing and vertical transfer portion of a solid state image pickup device employed in a previously proposed solid state image pickup apparatus;

FIG. 4 is a sectional view showing a portion of another example of a solid state image pickup device of the interline transfer type comprising a CCD;

FIGS. 5-A, 5-B and 5-C are waveform diagrams showing another example of a set of driving signals used for a photo-sensing and vertical transfer portion of a solid state image pickup device employed in a previously proposed solid state image pickup apparatus;

FIG. 6 is an illustration used for explaining occurrence of the defect of white and black spots;

FIGS. 7-A, 7-B, 8-A and 8-B are waveform diagrams showing a set of driving signals used for a photo-sensing and vertical transfer portion of a solid state image pickup device employed in one embodiment of the present invention;

EMBODIMENTS MOST PREFERABLE FOR WORKING OF THE INVENTION

First, to facilitate understanding of the embodiments of the invention, the configuration of a solid state image pickup device of the interline transfer type and the operation of such a solid state image pickup device employed in a previously proposed solid state image pickup apparatus will be explained with reference to FIGS. 1 to 6.

Figure 1:
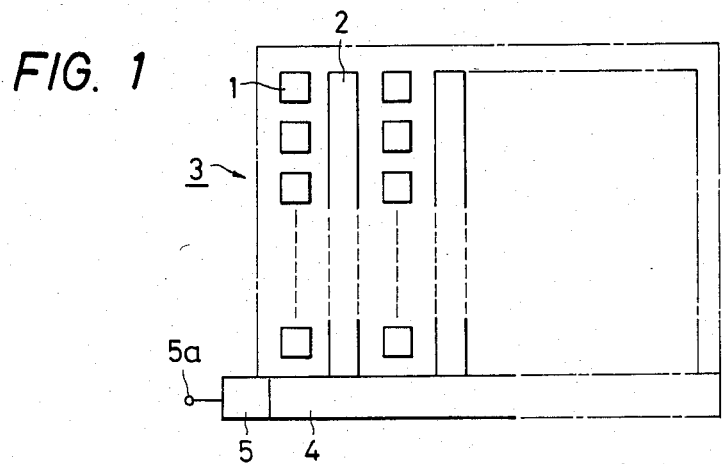
FIG. 1 is a schematic plane view showing one example of a solid state image pickup device of the interline transfer type comprising a CCD.

An example of a solid state image pickup device of the interline transfer type using a CCD is constituted as shown in FIG. 1, and comprises a photo-sensing and vertical transfer portion 3 which includes a plurality of photodetectors 1 arranged in horizontal and vertical rows and vertical transfer portions 2 each formed with a group of CCDs and provided along each of the vertical rows of the photodetectors 1, a horizontal transfer portion 4 coupled with the photo-sensing and vertical transfer portion 3 and an output portion 5 coupled with the horizontal transfer portion 4 and provided with a signal output terminal 5a, the whole of which are formed on a common semiconductor substrate.

In a solid state image pickup apparatus employing such a solid state image pickup device as mentioned above, a predetermined vertical transfer driving signal and a predetermined horizontal transfer driving signal are applied to the vertical transfer portions 2 and the horizontal transfer portion 4, respectively, so that vertical and horizontal charge transfers are performed in the solid state image pickup device. With such driving signals, signal charges obtained in the photodetectors 1 in response to the light received thereby during for example, one frame period are read out to the vertical transfer portions 2 and then transferred vertically toward the horizontal transfer portion 4 by the charge transfer operation of the vertical transfer portions 2 during each horizontal blanking period so that the signal charges produced in each horizontal row of the photodetectors 1 are transferred in turn to the horizontal transfer portion 4. The signal charges transferred to the horizontal transfer portion 4 are further transferred horizontally to the output portion 5 by the charge transfer operation of the horizontal transfer portion 4 during each horizontal video period and as a result of this an image pickup signal output is obtained at the signal output terminal 5a.

Figure 2A:
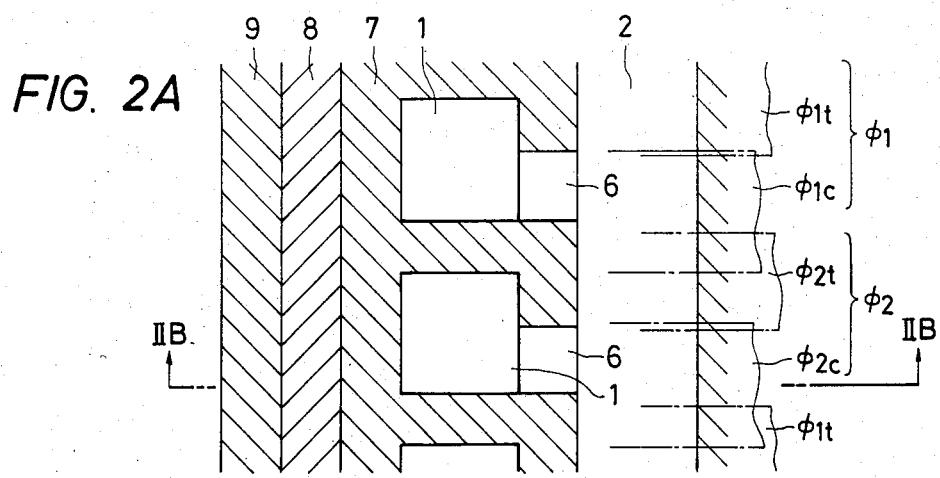
FIGS. 2-A and 2-B are plane and sectional views respectively showing an enlarged portion of the device shown in FIG. 1.
Figure 2B:
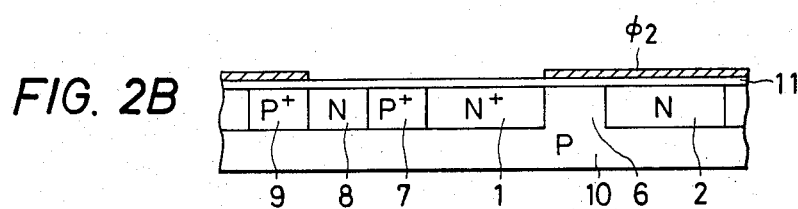

Going into details, the photo-sensing and vertical transfer portion 3 mentioned above contains transfer gate areas 6 provided between each vertical row of the photodetectors 1 and the corresponding one of the vertical transfer portions 2 and a channel stop area 7 provided around each of the photodetectors 1, as shown in FIG. 2-A. Further, an overflow drain 8 is provided to be contiguous to each of the channel stop areas 7 and each of the overflow drains 8 and the corresponding one of the vertical transfer portions 2 are separated by a channel stop area 9. On the vertical transfer portions 2, vertical transfer electrodes $\Phi_1$ and $\Phi_2$ each elongating in the horizontal direction are provided alternately in the vertical direction. Each vertical transfer electrode $\Phi_1$ is composed of a charge storage electrode $\Phi_{1c}$ and a charge transfer electrode ( potential barrier electrode ) $\Phi_{1t}$, and each vertical transfer electrode $\Phi_2$ is composed of a charge storage electrode $\Phi_{2c}$ and a charge transfer electrode $\Phi_{2t}$. In the vertical transfer portions 2, storage regions are formed under the charge storage electrodes $\Phi_{1c}$ and $\Phi_{2c}$ and transfer regions ( potential barrier regions ) are formed under the charge transfer electrodes $\Phi_{1t}$ and $\Phi_{2t}$, and each transfer region is subjected to the ion implantation or provided thereon with a thick insulating layer so as to have a potential shallower ( lower ) than that of the storage region adjacent thereto and to form a potential barrier. As shown in FIG. 2-B which shows a sectional view at the position indicated by arrows IIB—IIB in FIG. 2-A, the above mentioned portions and areas are formed on a semiconductor substrate 10 of, for example, the P type and an insulating layer 11 is provided to cover the whole of these portions and areas thereby with the vertical transfer electrodes ($\Phi_2$) provided thereon. In this example, the vertical transfer electrodes $\Phi_1$ and $\Phi_2$ include transfer gate electrodes at portions thereof, and therefore in FIG. 2-B, the vertical transfer electrode $\Phi_2$ ( more exactly, the charge storage electrode $\Phi_{2c}$ of the vertical transfer electrode $\Phi_2$) is extended to cover the transfer gate area 6.

In the previously proposed solid state image pickup apparatus employing the solid state image pickup device of the interline transfer type thus constituted, the vertical transfer electrodes $\Phi_1$ and $\Phi_2$ on the photo-sensing and vertical transfer portion 3 of the solid state image pickup device are supplied with driving signals $\Phi_1$ and $\Phi_2$ as shown in FIGS. 3-A and 3-B, respectively, and the voltages of thses driving signals $\Phi_1$ and $\Phi_2$ are applied to the transfer gate areas 6 and the vertical transfer portions 2 positioned under the vertical transfer electrodes $\Phi_1$ and $\Phi_2$. With such driving signals $\Phi_1$ and $\Phi_2$, the signal charges stored in each two photodetectors 1 adjacent vertically to each other are read out throuth the transfer gate areas 6 to the vertical transfer portions 2 from one of the two photodetectors 1 alternately at every field period so that the signal charges obtained in the photodetectors 1 are read out in the frame interlace reading manner, and the signal charges read out to the vertical transfer portions 2 are transferred vertically to the horizontal transfer portion 4. To achieve such operation, the driving signals $\Phi_1$ and $\Phi_2$ have reading pulses $R_1$ and $R_2$ of high level appearing at every frame period, respectively, and also transfer pulses $Q_1$ and $Q_2$ appearing with opposite phases at each horizontal blanking period, respectively. The signal charges are transferred vertically with the high level of the transfer pulse $Q_1$ and the low level of the transfer pulse $Q_2$.

When the reading pulse $R_2$ of driving signal $\Phi_2$ is supplied to the vertical transfer electrodes $\Phi_2$, the voltage of the reading pulse $R_2$ is applied to a first group of the transfer gate areas 6 under the vertical transfer electrodes $\Phi_2$ and the signal charges stored during one frame period in the photodetectors 1 corresponding to the first group of the transfer gate areas 6 are read out to the vertical transfer portions 2 as signal charges for the first field. Then, the signal charges read out to the vertical transfer portions 2 in response to the reading pulse $R_2$ are transferred vertically at each horizontal blanking period according to the voltages of the transfer pulses $Q_1$ and $Q_2$ applied to the vertical transfer portions 2 under the vertical transfer electrodes $\Phi_1$ and $\Phi_2$. After that, when the reading pulse $R_1$ of the driving signal $\Phi_1$ is supplied to the vertical transfer electrodes $\Phi_1$, the voltage of the reading pulse $R_1$ is applied to a second group of the transfer gate areas 6 under the vertical transfer electrodes $\Phi_1$ and the signal charges stored during one frame period in the photodetectors 1 corresponding to the second group of the transfer gate areas 6 are read out to the vertical transfer portions 2 as signal charges for the second field. Then, the signal charges read out to the vertical transfer portions 2 in response to the reading pulse $R_1$ are transferred vertically at each horizontal blanking period according to the voltages of the transfer pulses $Q_1$ and $Q_2$ applied to the vertical transfer portions 2 under the vertical transfer electrodes $\Phi_1$ and $\Phi_2$. The reading and transferring operation mentioned above is performed repeatedly.

In the case of a previously proposed solid state image pickup apparatus employing a solid state image pickup device of the interline transfer type in which independent transfer gate electrodes $\Omega$ are provided as shown in FIG. 4, two-level driving signals $\phi_1'$ and $\phi_2'$ having the transfer pulses $Q_1$ and $Q_2$, respectively, as shown in FIGS. 5-A and 5-B are supplied to the vertical transfer electrodes $\Phi_1$ and $\Phi_2$, respectively, and a reading pulse $R'$ appearing at every field period as shown in FIG. 5-C is supplied to the transfer gate electrodes $\Omega$. When the reading pulse $R'$ is supplied to the transfer gate electrodes $\Omega$, the signal charges in the photodetectors 1 corresponding to the transfer gate areas 6 which are contiguous to the regions in the vertical transfer portions 2 to which the voltage of the high level of either the driving signal $\phi_1'$ or $\phi_2'$ is applied are read out to the vertical transfer portions 2. The vertical transfer of the signal charges are carried out in response to the transfer pulses $Q_1$ and $Q_2$ in the same manner as taken in the device shown in FIGS. 2-A and 2-B.

When a picture is reproduced in response to the image pickup signal output obtained at the signal output terminal 5a of the solid state image pickup device employed in such previously proposed solid state image pickup apparatus as described above, the aforementioned white and black spots would be caused on the reproduced picture by a local area of deep potential that is, a local area with abnormally deep potential formed in the vertical transfer portions 2 of the solid state image pickup device. FIG. 6 shows a situation in which such a local area of deep potential as to cause the white and black spots is made undesirably. In FIG. 6, the steps in the storage regions $P_c$ and the transfer regions $P_t$ under the charge storage electrodes $\Phi_{1c}$ and $\Phi_{2c}$ and the charge transfer electrodes $\Phi_{1t}$ and $\Phi_{2t}$, which form the vertical transfer electrodes $\Phi_1$ and $\Phi_2$, show the depth of potential of the respective regions in process of charge transfer in the vertical transfer portion 2, which increases below, and x indicates the local area of deep potential formed undesirably in the vertical transfer portion 2. In this case, a MOS FET having its source S made of the area x, its gate G made of the storage region $P_c$ under the charge storage electrode $\Phi_{1c}$ and its drain D made of the transfer region $P_t$ under the charge transfer electrode $\Phi_{2t}$ is substantially formed and a flow of charges arises from the area x under the vertical transfer electrode $\Phi_1$ to an advanced potential well in the regions under the vertical transfer electrode $\Phi_2$ as a sub-threshold current of the MOS FET. If a charge transfer period in which each charge transfer in the vertical transfer portion 2 is carried out is constant and the interval between such charge transfer periods is made uniform, the amount of charges flowing from the area x to the advanced potential well is not varied and therefore the charges flowing into the advanced potential well do not raise any troublesome problem. However, as described above, the charge transfer in the vertical transfer portion 2 is carried out in response to the driving signals $\phi_1$ and $\phi_2$ shown in FIGS. 3-A and 3-B or the driving signals $\phi_1'$ and $\phi_2'$ shown in FIGS. 5-A and 5-B, and consequently, a long charge transfer period T appears once a frame period, as shown in FIGS. 3-A and 3-B or the FIGS. 5-A and 5-B. In the case of these driving signals, the long charge transfer period T appears to include a reading out period in which the signal charges for the second field are read out to the vertical transfer portion 2. During this long charge transfer period T, the area x transfers the charges stored therein in large quantities compared with the normal amount of charges to the advanced potential well so as to supply excessive signal charges to the latter and, to the contrary, to make the regions positioned behind be lacking in signal charges. This causes the white and black spots in such a manner as aforementioned.

Now, preferred embodiments of the present invention will be explained in detail hereinafter.

One example of a solid state image pickup apparatus according to the present invention is constituted with the solid state image pickup device having the configuration shown in FIGS. 1, 2-A and 2-B and two-phase driving signals $\phi_{11}$ and $\phi_{12}$ shown in FIGS. 7-A and 7-B, which are supplied to the vertical transfer electrodes $\Phi_1$ and $\Phi_2$ of the solid state image pickup device, respectively. The driving signals $\phi_{11}$ and $\phi_{12}$ are formed into three-level signals, respectively. The driving signal $\phi_{11}$ contains a reading pulse $R_{11}$ taking a first high level $V_R$ and a transfer pulse $Q_{11}$ appearing with the low level $V_L$ in each horizontal blanking period and further takes a second high level $V_H$ lower than the first high level $V_R$ during each horizontal video period. The driving signal $\phi_{12}$ contains a reading pulse $R_{12}$ taking the first high level $V_R$ and a transfer pulse $Q_{12}$ appearing with the low level $V_L$ in each horizontal blanking period and further takes the second high level $V_H$ during each horizontal video period. The transfer pulses $Q_{11}$ and $Q_{12}$ take the respective phases different from each other in each horizontal blanking period.

FIG. 8 shows in enlarged scale the portions of the driving signals $\phi_{11}$ and $\phi_{12}$ encircled with a broken line in FIG. 7-A and 7-B. As shown in FIG. 8, the transfer pulses $Q_{11}$ and $Q_{12}$, each of which has the pulse width $\tau_1$ of about 2 $\mu$sec, appear with the time difference $\tau_2$ of about 3 $\mu$sec between them within the horizontal blanking period $H_B$, and each of the reading pulses $R_{11}$ and $R_{12}$ has the pulse width $\tau_3$ of about 20 $\mu$ sec. With the supply of these driving signals $\phi_{11}$ and $\phi_{12}$, the voltage having the second high level $V_H$ is applied to the storage regions of the vertical transfer portions 2 under the charge storage electrodes $\Phi_{1c}$ and $\Phi_{2c}$ and the transfer regions of the vertical transfer portions 2 under the charge transfer electrodes $\Phi_{1t}$ and $\Phi_{2t}$ during each horizontal video period, and the charge transfer in the vertical transfer portions 2 is carried out when the voltage having the low level $V_L$ of the transfer pulse $Q_{11}$ is first applied to the regions under the vertical transfer electrodes $\Phi_1$ and then the voltage having the low level $V_L$ of the transfer pulse $Q_{12}$ is applied to the regions under the vertical transfer electrodes $\Phi_2$ within each horizontal blanking period.

Further, the transfer of signal charges from the photodetectors 1 to the vertical transfer portions 2 is performed as mentioned below.

When the reading pulse $R_{12}$ of the driving signal $\phi_{12}$ is supplied to the vertical transfer electrodes $\phi_2$, the voltage having the first high level $V_R$ of the reading pulse $R_{12}$ is applied to the transfer gate areas 6 under the charge storage electrodes $\Phi_{2c}$ and the signal charges stored during one frame period in the photodetectors 1 corresponding to the transfer gate areas 6 under the charge storage electrodes $\Phi_{2c}$ are read out to the storage regions of the vertical transfer portions 2 under the charge storage electrodes $\Phi_{2c}$ as signal charges for the first field. After that, when the reading pulse $R_{11}$ of the driving signal $\phi_{11}$ is supplied to the vertical transfer electrodes $\Phi_1$, the voltage having the first high level $V_R$ of the reading pulse $R_{11}$ is applied to the transfer gate areas 6 under the charge storage electrodes $\Phi_{1c}$ and the signal charges stored during one frame period in the photodetectors 1 corresponding to the transfer gate areas 6 under the charge storage electrodes $\Phi_{1c}$ are read out to the storage regions of the vertical transfer portions 2 under the charge storage electrodes $\Phi_{1c}$ as signal charges for the second field. This reading operation is performed repeatedly and as a result the signal charges obtained in the photodetectors 1 are read out in the frame interlace manner.

The amplitude $V_R-V_H$ of each of the reading pulses $R_{11}$ and $R_{12}$ is selected to be smaller than the amplitude $V_H-V_L$ of each of the transfer pulses $Q_{11}$ and $Q_{12}$, so that the reading pulse $R_{11}$ or $R_{12}$ is prevented from making such potential steps in the vertical transfer portions 2 as will cause charge transfer in the vertical transfer portions 2.

In addition, it is preferable to provide a vertical output gate portion at the end of each of the vertical transfer portions 2 and make the vertical output gate portions be in the ON state in response to the transfer pulse $Q_{11}$ or $Q_{12}$ so as to transfer the signal charges to the horizontal transfer portion 4 from the vertical transfer portions 2 in order to prevent the signal charges being in process of transfer in the horizontal transfer portion 4 from flowing into the vertical transfer portions 2.

As described above, with the two-phase driving signals $\phi_{11}$ and $\phi_{12}$ supplied to the vertical transfer electrodes $\Phi_1$ and $\Phi_2$, the signal charges obtained in the photodetectors 1 are read out to the vertical transfer portions 2 in the frame interlace manner. Further, since the signal charges read out to the vertical transfer portions 2 are transferred in the vertical transfer portions 2 only during the periods of the transfer pulses $Q_{11}$ and $Q_{12}$ within each horizontal blanking period, the charge transfer period in which each charge transfer in the vertical transfer portions 2 is carried out is kept constant and the interval between such charge transfer periods is made uniform and, as a result of this, an image pickup signal output from which a picture without the white and black spots thereon is reproduced can be obtained at the signal output terminal 5a.

Although the solid state image pickup device having the vertical transfer portions which are drived to be operative by the two-phase driving signals is employed in the embodiment described above, a solid state image pickup device having vertical transfer portions which are arranged to be driven by a four-phase driving signals can be used for the solid state image pickup apparatus according to the present invention.

Figure 9:
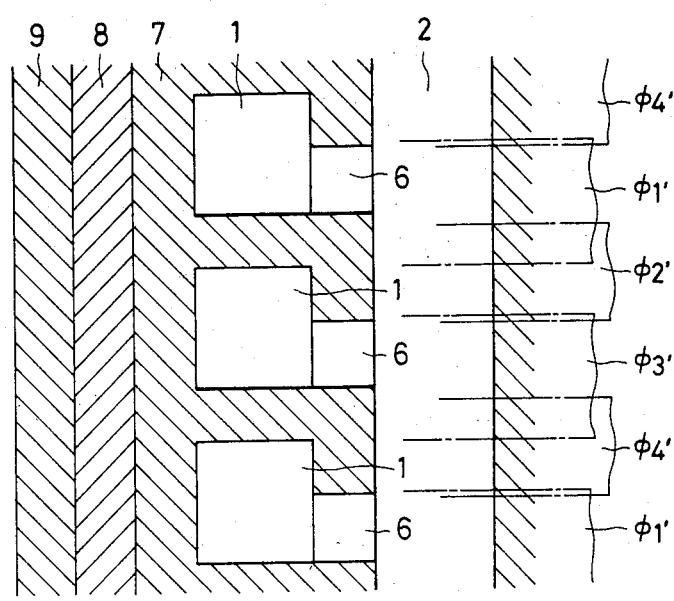
FIG. 9 is a plane view showing an enlarged portion of a solid state image pickup device employed in another embodiment of the present invention.
Figure 10A:
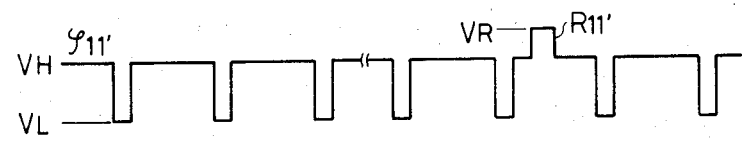
FIGS. 10-A, 10-B, 10-C and 10-D are waveform diagrams showing a set of driving signals used for a photosensing and vertical transfer portion of the solid state image pickup device having the portion shown in FIG. 9.
Figure 10B:
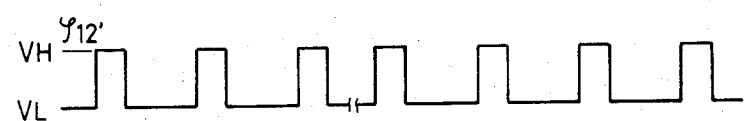
Figure 10C:
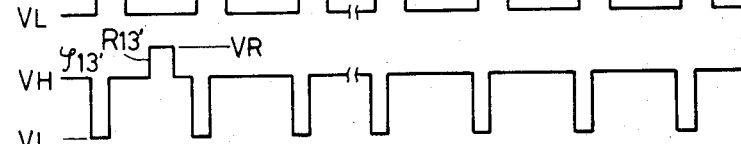
Figure 10D:
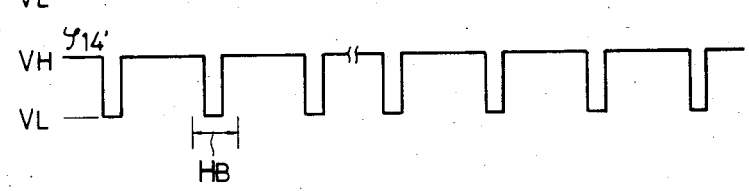

FIG. 9 shows the configuration of a photosensing and vertical transfer portion in the solid state image pickup device having the vertical transfer portions which are arranged to be drived by the four-phase driving signals employed in another embodiment of the present invention.

In FIG. 9, portions and areas corresponding to those of FIG. 2-A are marked with the same references. In this case, vertical transfer electrodes $\Phi_1'$, $\Phi_2'$, $\Phi_3'$ and $\Phi_4'$ are independent and arranged in order repeatedly. The vertical transfer electrodes $\Phi_1'$ and $\Phi_3'$ include respective transfer gate electrodes at the portions thereof.

FIGS. 10-A, 10-B, 10-C and 10-D show four-phase driving signals $\phi_{11}'$, $\phi_{12}'$, $\phi_{13}'$ and $\phi_{14}'$ which are supplied to the vertical transfer electrodes $\Phi_1'$, $\Phi_2'$, $\Phi_3'$ and $\Phi_4'$ of the device shown in FIG. 9, respectively.

With such four-phase driving signals $\phi_{11}'$, $\phi_{12}'$, $\phi_{13}'$ and $\phi_{14}'$, in the vertical transfer portions 2, the storage regions are formed under the vertical transfer electrodes $\Phi_1'$, $\Phi_3'$ and $\Phi_4'$ and the transfer regions are formed under the vertical transfer electrodes $\Phi_2'$. The signal charges obtained in the photodetectors 1 are read out to the vertical transfer portions 2 at every field period in the frame interlace manner in response to reading pulses $R_{11}'$ and $R_{13}'$ taking the first high level $V_R$ and contained in the driving signals $\phi_{11}'$ and $\phi_{13}'$, respectively, and the voltage having the second high level $V_H$ is applied to the storage regions in the vertical transfer portions 2 during each horizontal video period.

Although, in this embodiment, the voltage having the low level $V_L$ of the driving signal $\phi_{12}'$ only the transfer regions of the vertical transfer portions 2 under the vertical transfer electrodes $\Phi_2'$ during each horizontal video period, it is also possible to arrange so that the transfer regions of the vertical transfer portions 2 are formed under the vertical transfer electrodes $\Phi_4'$ and the voltage having the low level $V_L$ is applied to the transfer regions under the vertical transfer electrodes $\Phi_4'$ during each horizontal video period.

In this embodiment, the charge transfer in the vertical transfer portions 2 is carried out when the driving signal $\phi_{12}'$ takes the second high level $V_H$ and the transfer pulses taking the low level $V_L$ and contained in the driving signals $\Phi_{11}'$, $\Phi_{13}'$ and $\Phi_{14}'$, respectively, appear with the respective different phases within each horizontal blanking period. When the charge transfer operation is performed in the vertical transfer portions 2, the voltage having the second high level $V_H$ is applied to the regions in the vertical transfer portions 2 under two or three adjacent ones of the vertical transfer electrodes $\Phi_1'$ to $\Phi_4'$ simultaneously so that the potential well is formed in turn in these regions. This results in the increased charge transfer efficiency. The amplitude $V_R$-$V_H$ of each of the reading pulses $R_{11}'$ and $R_{13}'$ is selected to be smaller than the amplitude $V_H$-$V_L$ of each of the transfer pulses appearing in the horizontal blanking period for the same reason as aforementioned.

In this case also, the charge transfer period in which each charge transfer in the vertical transfer portions 2 is carried out is kept constant and the interval between the charge transfer periods is made uniform and consequently an image pickup signal output from which a picture without the white and black spots thereon is reproduced can be obtained.

Applicability for Industrial Use

As described above, the solid state image pickup apparatus according to the present invention can produce an image pickup signal output being superior in quality, from which a picture without the white and black spots thereon is reproduced, and therefore is quite suitable for constituting a high-grade television camera miniaturized in size and lightened in weight.

I claim:

1. A solid state image pickup apparatus employing a solid state image pickup device which comprises a plurality of photodetectors arranged horizontally and vertically, transfer gate areas each corresponding to each of the photodetectors, a plurality of vertical transfer portions comprising charge coupled devices each extending vertically and positioned contiguously to the transfer gate areas which have transfer areas and storage regions, and a horizontal transfer portion coupled with the end of each of the vertical transfer portions and an output portion, wherein a reading pulse voltage which takes a first high level is applied to an even numbered rows of transfer gates during even field periods and is applied to odd numbered rows of transfer gates during odd field periods, so that signal charges are read out from said storage regions of said vertical transfer portions, a voltage which takes a second high level which is lower than said first high level is applied to said storage regions of said vertical transfer portions during each horizontal video period, transfer pulse voltages which take a low level at respective different phases within each horizontal blanking period are applied to said vertical transfer portions, so that the signal charges which are read out to said vertical transfer portions are transferred vertically to said horizontal transfer portion, and the signal charges which have been transferred to the horizontal transfer portion are further transferred in the horizontal direction through the horizontal transfer portion to an output portion.

* * * * *